United States Patent
Klemm et al.

(10) Patent No.: US 6,189,806 B1
(45) Date of Patent: Feb. 20, 2001

(54) METALLIZING DEVICE FOR VACUUM METALLIZING

(75) Inventors: Günter Klemm, Nidda; Hans Neudert, Freigericht; Wolfgang Achtner, Maintal, all of (DE)

(73) Assignee: Leybold Systems GmbH, Hanau (DE)

( * ) Notice: Under 35 U.S.C. 154(b), the term of this patent shall be extended for 0 days.

(21) Appl. No.: 09/401,722

(22) Filed: Sep. 23, 1999

(30) Foreign Application Priority Data

Sep. 24, 1998 (DE) .............................. 198 43 818

(51) Int. Cl.[7] .................. B05B 1/24; B05C 5/04
(52) U.S. Cl. .............. 239/82; 239/83; 392/388; 118/726
(58) Field of Search ................. 239/79, 81–83; 392/383, 386, 480; 373/118; 432/156, 13; 118/726, 721; 266/200

(56) References Cited

U.S. PATENT DOCUMENTS

| | | |
|---|---|---|
| 3,450,097 * | 6/1969 | Firestone et al. ............ 329/388 |
| 3,661,117 | 5/1972 | Cornelius et al. . |
| 3,690,683 | 9/1972 | Roblin et al. . |
| 3,971,334 | 7/1976 | Pundsack . |
| 5,016,566 * | 5/1991 | Levchenko et al. ........... 118/726 |
| 5,182,567 * | 1/1993 | Wilder ........................ 392/388 X |
| 5,904,958 * | 5/1999 | Dick et al. .................... 118/726 X |

FOREIGN PATENT DOCUMENTS

| | | |
|---|---|---|
| 491208 | 7/1970 | (CH) . |
| 868091 | 1/1953 | (DE) . |
| 4133615 | 9/1994 | (DE) . |
| 4422697 | 1/1996 | (DE) . |
| 337369 | 10/1989 | (EP) . |
| 683808 | 12/1952 | (GB) . |

* cited by examiner

Primary Examiner—Lesley D. Morris
(74) Attorney, Agent, or Firm—Smith, Gambrell & Russell, LLP

(57) ABSTRACT

A metallizing device for vacuum metallizing arrangements is disclosed having a vaporizer (3) heated by an electrical heating rod (8). This vaporizer (3) is connected to a nozzle element (1) in the form of a hollow body. For the purpose of vaporizing a substrate, vapor flows out of the vaporizer (3) into the nozzle element (1) and from there out of a nozzle gap (2) toward the substrate.

15 Claims, 2 Drawing Sheets

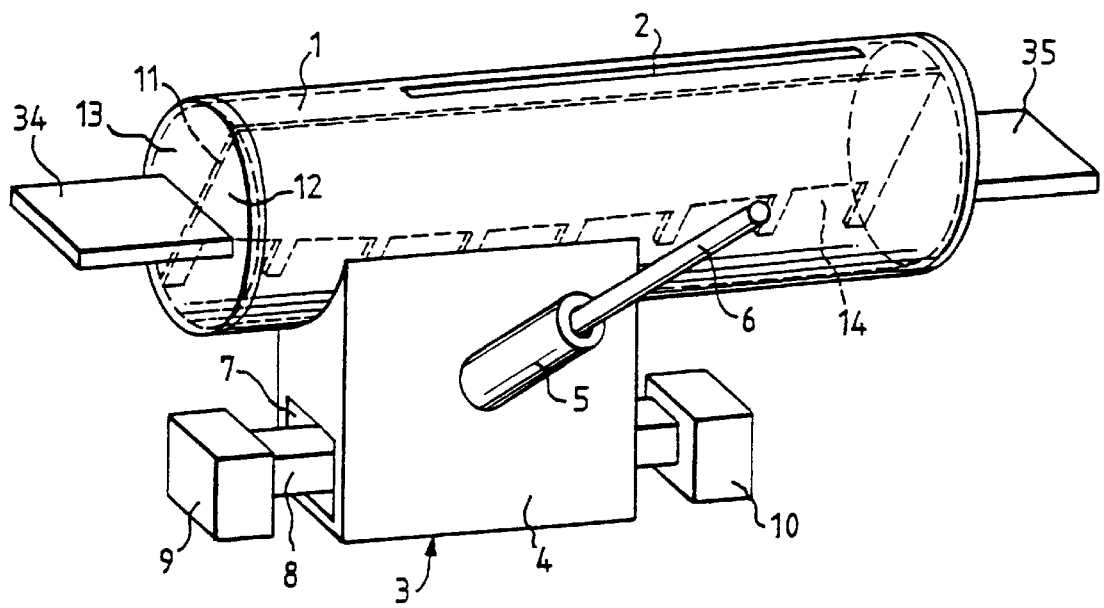
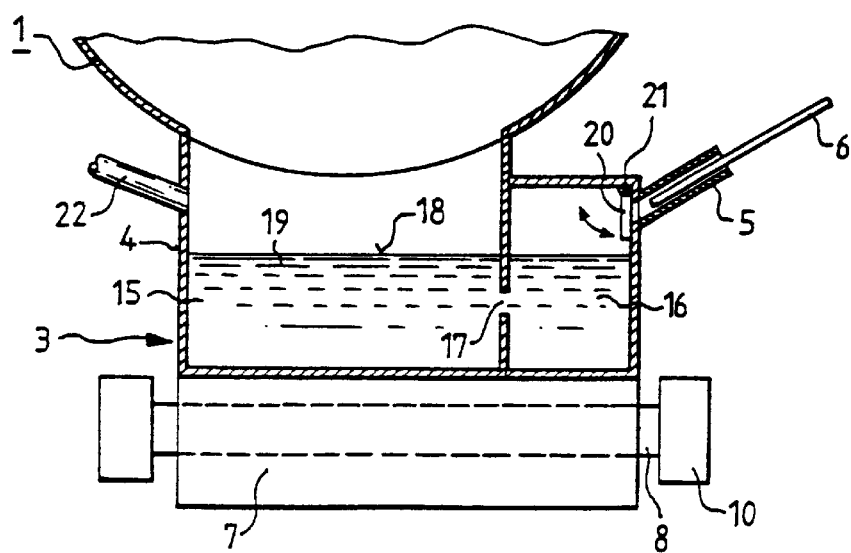

METALLIZING DEVICE FOR VACUUM METALLIZING

INTRODUCTION AND BACKGROUND

The present invention relates to a metallizing device for vacuum metallizing arrangements having a vaporizer heated by an electrical heater and a pot for vaporizing added metal and a nozzle element with a nozzle gap allowing the produced metal vapor to exit.

For the metallizing of foils with, for example, aluminum, copper or other metals with a high melting point, usually so-called evaporation boats are arranged in a vacuum chamber which consists of electrically conductive ceramics and through which, for the purpose of vaporizing added metals, an electrical current flows. These evaporation boats, at times, form a pot for the metal to be vaporized through a hollowed out area. For this purpose, the space above the evaporation boats is completely open so that the metal vaporized in them can directly reach a foil guided above the evaporation boats and can be precipitated through condensation. Such open metallizing devices can be used only for metals with a low vapor pressure because only then the vapor rises to the substrate in a manner extensively directed upwardly. Nonetheless, relatively large areas of the coating arrangement can be reached by the vapor and may be contaminated by it. This leads to the point that the arrangement must be shut down and cleaned relatively frequently so that no long, uninterrupted processing times are possible.

There are known metallizing devices for zinc in which a pot with the metal to be vaporized is arranged in a large-volume vaporizer housing. The heating of this pot takes place indirectly by means of heating coils in ceramic elements. The vaporizer housing is covered towards the top by means of a nozzle element in the form of a plate or a strip, wherein the nozzle element has a nozzle gap through which the vapor reaches the foil to be coated. The nozzle gap must be as long as the foil to be coated is wide because the foil is guided across this nozzle gap for the purpose of coating. For this reason, the vaporizer housing must be correspondingly wide and thus of a large volume.

Such large-volume metallizing devices result in a situation where their heating requires more time than the time needed for producing the necessary vacuum in the coating arrangement. Therefore, the metallizing device must at first be locked by a shutter and then heated before the metallizing of the foil can begin. In the case of high rates of evaporation, so much metal is precipitated on the shutter that it can fall off it and close the nozzle gap either entirely or partially. An additional disadvantage of large-volume metallizing arrangements lies in that the adjustment of the rate of evaporation is very slow which is due to the large bulk of such metallizing arrangements and the large mass of metal inside it which is to be vaporized and due to the fact that the temperature in the metallizing device can be measured only indirectly at the outside wall of the heating pipe. With such metallizing arrangements it is also problematic that, due to wear and tear, short maintenance cycles result and insulation errors or plasma ignition occur. Furthermore, the melting of new zinc with the necessary removal of the oxide skin and the handling of liquid zinc is dangerous and time-consuming.

An object of the invention therefore is to construct a metallizing device of the initially mentioned type in such a way that the rate of evaporation can be changed as rapidly as possible and the possibly minimal contaminations are directed through the vaporized metal so that processing times, which are as long as possible, can be realized with the arrangement without resulting in a standstill.

SUMMARY OF THE INVENTION

The above and other objects of the invention can be achieved by a nozzle element in the form of a hollow element and by a vaporizer which has a vaporizer housing connected to the nozzle element and forms the pot.

Through this separation of the vaporizer housing from the nozzle element, in accordance with the invention, a separation of function takes place. The vaporizer merely has the task of producing metal vapor while the nozzle element has the exclusive task of distributing the metal vapor directed to it via the required cross-section and to allow it to exit. This separation of function makes it possible to construct the vaporizer with a very small volume so that it needs to contain merely a small amount of metal as a metal bath and, for this reason, the rate of evaporation can be easily adjusted and rapidly changed. Since the vaporizer housing simultaneously forms the pot for the metal to be vaporized, it is possible to measure the temperature of the liquid metal directly at the vaporizer housing so that changes can be determined rapidly which, again, results in an increase in control and enhances good adjustability.

BRIEF DESCRIPTION OF THE DRAWINGS

The invention will be further understood with reference to the accompanying drawings, wherein:

FIG. 1 is a perspective schematic view of a first embodiment of a metallizing arrangement in accordance with the invention;

FIG. 2 is a partial cross-section through a lower area of an additional embodiment of the metallizing arrangement;

DETAILED DESCRIPTION OF THE INVENTION

Figure 3:
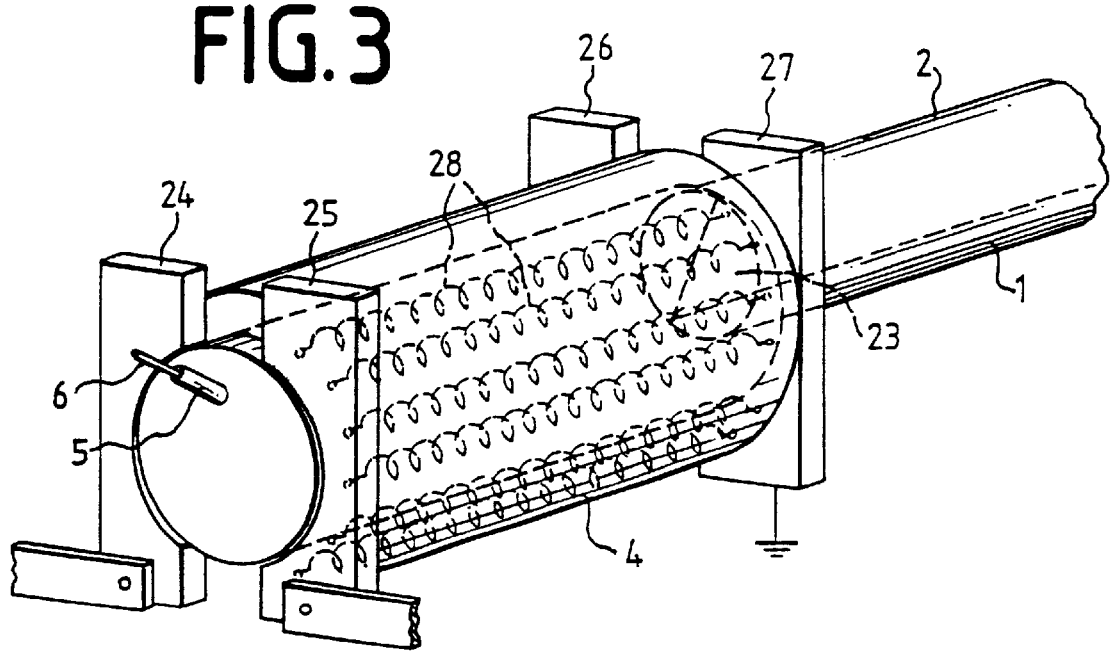
FIG. 3 is a perspective representation of a third embodiment of the metallizing arrangement.

With respect to its construction, the metallizing arrangement of the present invention is constructed in a particularly simple manner and for smaller rates of metallizing, can be regulated adequately enough when, in accordance with an advantageous further development of the invention, the nozzle element is in the form of a cylinder arranged horizontally and the vaporizer is connected with its vaporizer housing with a portion of the cover surface of the nozzle element.

Due to the supply of the metal to be melted and vaporized, a spattering of liquified metal can occur. Such spatters cannot reach the substrate to be coated when, in accordance with another embodiment of the invention, the vaporizer housing is divided into a charge chamber and a vaporizer chamber and the charge chamber and the vaporizer chamber have a liquid connection below the level of the liquid of the melted metal bath.

Also, in the case of very wide nozzle elements, it is possible to achieve a uniform vapor exit across the entire width of the nozzle gap when the nozzle element is divided by a separation wall into an outlet chamber having the nozzle gap and into an inlet chamber connected with the vaporizer and when the separation wall has several vapor passages increasing in their cross-section in proportion to the increase in distance from the vaporizer.

The separation wall is of particularly simple construction and can very simply be adapted to a variety of requirements when the vapor outlets are provided on the lower side of the separation wall in the form of recesses which are open toward the underside and when the cross-section of these vapor outlets varies due to varying height of the vapor outlets.

The heating of the vaporizer is optimal in its arrangement when the vaporizer housing has a base in the form of a steel pipe and when through this steel pipe, at a distance from its inner wall, a heating rod passes which is made of electrically conductive ceramics. Such a heating acts like comparable radiant heating arrangements. However, due to the small cross-section of the steel pipe, magnetic saturation of the steel pipe takes place leading to high electrical losses and therefore to a considerable heating of the steel pipe. For this reason, in accordance with the invention, the heating acts as a radiant as well as an induction heating arrangement.

For the formation of the heating arrangement, it is possible to utilize structural components which are used for evaporation boats and therefore can be obtained relatively inexpensively when the steel pipe has a rectangular cross-section and the heating rod is a typical vaporizer boat.

When, at the end of the metallizing process, no material needs to be directed any longer to the vaporizer or when, during the process, new material in the form of wire is to be introduced, it is possible to prevent the escape of vapor through the opening necessary for the supply of the metal in the form of a wire inside the vaporizer by the arrangement of a supply pipe which has a closure element which seals the interior of the vaporizer housing with respect to the outside when the wire-like metal has not been introduced.

The closure is particularly simple when it is in the form of a flap opening towards the interior of the vaporizer housing.

In the case of larger coating arrangements, the required metallizing arrangements are so large that the time for heating the metallizing arrangement is considerably longer than the pump-out time of the entire coating arrangement. In such cases, the metallizing arrangement can be heated below normal pressure when, in accordance with an additional development of the invention, a blocking device is placed into the connection between the vaporizer and the nozzle element.

During the heating of the metallizing arrangement in the presence of normal pressure, the penetration of air due to leakages into the metallizing device can be prevented in a simple way in which the vaporizer has an inert gas connection. Hereby, it is made possible to keep the interior of the vaporizer under excess pressure prior to connection with the coating arrangement, so that also in the case of small leakages, no oxygen reacting with the metal to be vaporized can enter the vaporizer.

For higher rates of evaporation, a structural arrangement has proven itself to be advantageous, wherein the vaporizer housing is connected to one front face of the nozzle element. With such an embodiment, the arrangement of a larger vaporizer prevents problems with respect to space.

A uniform vapor outlet across the entire length of the nozzle gap can be achieved in a simple manner in that the vaporizer housing is connected to that area of the front face of the nozzle element which forms an inlet chamber by means of the separation wall.

For the additional simplification of the structural assembly of the metallizing arrangement, it is useful when the vaporizer housing is cylindrical and the nozzle element is connected eccentrically at the upper side of a front face of the vaporizer housing.

The separation of the vaporizer housing from the nozzle element may be achieved with minimum effort when, in accordance with another further development of the invention, the closure between the vaporizer housing and the nozzle element is formed by means of a rotary slide in the connection of the nozzle element to the vaporizer housing.

In the case of a cylindrical vaporizer housing, the heating can take place in a structurally simple manner in that at both front faces of the vaporizer housing, two flange plates gripping across the vaporizer housing are arranged as a current supply, wherein the flange plates of the one front face are connected with the ground and the other flange plates are connected with a voltage supply and in that between the flange plates of the two front faces, heating wires are guided externally along the vaporizer housing.

Since during the operation of the coating arrangement the metallizing arrangement operates under vacuum, the heating wires can transfer merely radiant heat to the vaporizer housing. The heat, which is radiated toward the opposite side, is reflected toward the vaporizer housing when the heating wires are surrounded by a metal cover arranged coaxially with respect to the vaporizer housing.

A particularly high heating output can be achieved with little effort when the heating wires are coiled and, for the time being, are arranged with an insulating element open toward the vaporizer housing with a smaller cross-section than that corresponding to the diameter of the coils of the heating wire.

The metallizing arrangement, shown in FIG. 1 as a whole, which is intended in particular for vaporizing zinc in a foil coating arrangement, has a tubular nozzle element (1) with a nozzle gap (2) extending longitudinally in its cover surface from which, during the operation of the arrangement, the vapor necessary for the coating of a foil, escapes. At the underside of the nozzle element (1), a vaporizer (3) with a vaporizer housing (4) is attached. The vaporizer housing (4) has a transverse supply pipe (5) through which metal in the form of a wire (6) can be introduced inside the vaporizer (3). For the purpose of heating, the base of the vaporizer housing (4) is in the form of a steel pipe (7) which is rectangular in its cross-section and through which a heating rod (8) of electrically conducting ceramics is guided. For the purpose of heating the vaporizer (3), electrical energy flows through the heating rod (8) from a current connection (9) towards a current connection (10) at the other end of the heating rod (8). In the case of the heating rod (8), a typical evaporation boat may be involved.

The nozzle element (1) is divided into an inlet chamber (12) and an outlet chamber (13) by a diagonally arranged separation wall (11), represented by interrupted lines. For this purpose, the separation wall (11) is constructed in such a way, that the vaporizer (3) is connected exclusively with the inlet chamber (12) and the nozzle gap (2) is connected exclusively with the outlet chamber (13). In the underside of the separation wall (11), several vapor passages (14) are provided through which the vapor, traveling from the vaporizer (3) into the inlet chamber (12), can flow into the outlet chamber (13). In order to achieve uniform vapor distribution, the cross-section of these vapor passages (14), due to variation in height, is greater the more distant these vapor passages (14) are from the vaporizer (3).

In order to prevent vapor extending into the nozzle element (1) from condensing there, the nozzle element (1) has at both ends, respectively, an electrical connection (34, 35). Thereby it is possible, by means of high-current flowing through the nozzle element (1), to see to it that the nozzle element (1) constantly has a temperature which lies approximately 100° C. above the melting temperature of the material to be evaporated.

In the case of the embodiment according to FIG. 2, the vaporizer housing (4) is divided into a vaporizer chamber (15) and a charging chamber (16). Only the vaporizer chamber (15) has a connection to the nozzle element (1). A liquid connection element (17) connects the charging chamber (16) with the vaporizer chamber (15). This liquid connection element (17) is arranged so low that it is located constantly below the liquid level (18) of a metal bath (19) present in the vaporizer housing (4). In this embodiment, the supply pipe (5) leads into the interior of the charging chamber (16) so that the introduced wire (6) is melted down in the charging chamber (16). This melt moves via the liquid connection element (17) into the vaporizer chamber (15), wherein due to the effect of the heating rod (8) which is aligned in this embodiment transversely with respect to the nozzle element (1), the metal vaporizes and reaches the nozzle element (1). At the point where the supply pipe (5) opens into the charging chamber (16), a closure (20) is provided in the charging chamber (16) which can be moved by means of a flap pivotable about a hinge (21). This closure element (20) is pretensioned in the direction of closure so that the supply pipe (5) necessarily closes when the wire (6) is pulled out. Thereby, a penetration of air into the charging chamber (16) is prevented. An inert gas connection (22) at the housing (4) of the vaporizer (3) permits the supply of inert gas when the vaporizer (3) is not under vacuum and is heated separately from the nozzle element (1).

In the embodiment according to FIG. 3, the vaporizer housing (4) is formed cylindrically and is arranged on the front face before the nozzle element (1). Therefore, in this embodiment, the vapor produced in the vaporizer housing (4) flows axially across a passage (23) into the nozzle element (1). The nozzle element (1) is constructed comparable to the one according to FIG. 1. Again, it has the separation wall (11) shown in FIG. 1 so that the vapor travels at first into the inlet chamber (12), also shown only in FIG. 1, and from there into the outlet chamber (13) toward the nozzle gap (2). Near both front faces of the vaporizer housing (4), respectively, two flange plates (24, 25; 26, 27) grip partially across the vaporizer housing (4). Between the pairs of flange plates (24, 25; 26, 27), at the front faces of the vaporizer housing (4), coiled heating wires (28) are provided so that electrical energy can flow from the flange plates (24, 25) through the heating wires (28) to the flange plates (26, 27).

Figure 4:
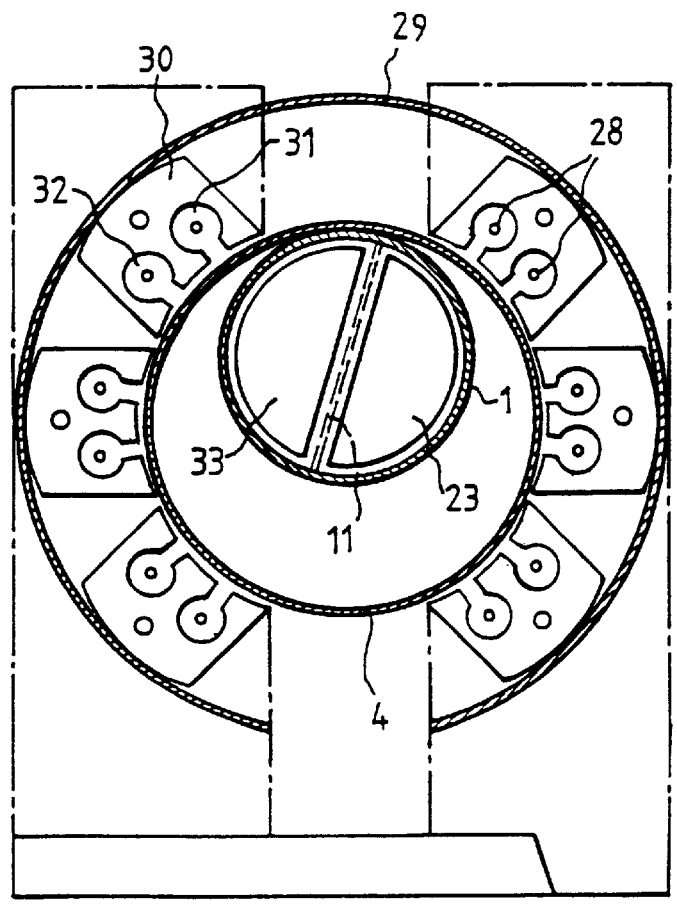
FIG. 4 is a cross-section through the metallizing arrangement according to FIG. 3.

FIG. 4 shows that the vaporizer housing (4) is surrounded by a coaxial metal cover (29). In the annular chamber between the metal cover (29) and the vaporizer housing (4), insulating elements (30) are arranged in radial alignment. With this embodiment, each insulating element (30) has two receiving elements (31, 32) which are open toward the vaporizer housing (4) and which accommodate the respective, spiral heating wire (28).

In FIG. 4, also the sector-shaped passage (23) can be seen across which the vapor produced in the vaporizer housing (4) reaches the nozzle element (1) shown in FIG. 3. A blocking device (33) in the form of a rotary slide, wherein a segment-like part is involved, can be pivoted on the passage (23) and thereby can interrupt the connection from the vaporizer housing (4) to the nozzle element (1).

In this embodiment, the introduction of the wire (6) can, similar to the way according to the FIGS. 1 and 2, take place via a supply pipe (5) which now, however, is arranged at the front wall of the vaporizer housing (4).

Further variations and modifications will be apparent to those skilled in the art from the foregoing and are intended to be encompassed by the claims appended hereto.

German application 198 43 818.4 is relied on and incorporated herein by reference.

We claim:

1. A metallizing device for a vacuum-metallizing arrangement, comprising:

a vaporizer, including a vaporizer housing that defines a pot for containing introduced metal to be vaporized, wherein the vaporizer includes an electrical heater for heating the introduced metal, wherein the vaporizer housing is divided into a charging chamber and a vaporizer chamber, and wherein the charging chamber and the vaporizer chamber have a liquid connection element therebetween located below a liquid level of a melted metal material to be contained in the vaporizer housing; and a nozzle element with a nozzle gap to allow produced metal vapor to exit, wherein the nozzle element includes a hollow element connected to the vaporizer.

2. A metallizing device for a vacuum-metallizing arrangement, comprising:

a vaporizer, including a vaporizer housing that defines a pot for containing introduced metal to be vaporized, wherein the vaporizer includes an electrical heater for heating the introduced metal; and a nozzle element with a nozzle gap to allow produced metal vapor to exit, wherein the nozzle element includes a hollow element connected to the vaporizer, wherein the nozzle element is divided by a separation wall into an outlet chamber having the nozzle gap and an inlet chamber connected with the vaporizer, and wherein the separation wall has several vapor passages which increase in their cross-section with increasing distance from the vaporizer housing.

3. The metallizing device, in accordance with claim 2, wherein the vapor passages are provided at a lower side of the separation wall as recesses which are open toward an underside of the separation wall, and the cross-section of the vapor passages varies due to a variation in height of the vapor passages.

4. The metallizing device, in accordance with claim 3, wherein the vaporizer housing has a base including a steel pipe defined therein, and the electrical heater of the vaporizer includes a heating rod made of electrically conductive ceramics extending through said steel pipe at a distance with respect to an inner wall of said pipe.

5. The metallizing device, in accordance with claim 4, wherein the steel pipe has a rectangular cross-section, and the heating rod is an evaporation boat.

6. A metallizing device for a vacuum-metallizing arrangement comprising:

a vaporizer, including a vaporizer housing that defines a pot for containing introduced metal to be vaporized, wherein the vaporizer includes an electrical heater for heating the introduced metal;

a nozzle element with a nozzle gap to allow produced metal vapor to exit, wherein the nozzle element includes a hollow element connected to the vaporizer; and a supply pipe for supplying the metal to be vaporized in the form of a wire inside the vaporizer housing, wherein the supply pipe has a closure element which is sealed with respect to an exterior of the vaporizer housing when the metal wire is not being introduced into an interior of the vaporizer housing.

7. The metallizing device, in accordance with claim 6, wherein the closure element is a flap opening toward the interior of the vaporizer housing.

8. A metallizing device for a vacuum-metallizing arrangement, comprising:

a vaporizer, including a vaporizer housing that defines a pot for containing introduced metal to be vaporized, wherein the vaporizer includes an electrical heater for heating the introduced metal, and wherein the vaporizer has an inert gas connection; and a nozzle element with a nozzle gap to allow produced metal vapor to exit, wherein the nozzle element includes a hollow element connected to the vaporizer.

9. A metallizing device for a vacuum-metallizing arrangement, comprising a vaporizer, including a vaporizer housing that defines a pot for containing introduced metal to be vaporized, wherein the vaporizer includes an electrical heater for heating the introduced metal, and wherein the vaporizer housing includes a front wall; and a nozzle element with a nozzle gap to allow produced metal vapor to exit, wherein the nozzle element includes a hollow element connected to the vaporizer, wherein the nozzle element is divided by a separation wall into an outlet chamber having the nozzle gap and an inlet chamber connected with the vaporizer, wherein the vaporizer housing is connected to a front face of the nozzle element, to an area of the front face of the nozzle element that forms the inlet chamber, and wherein the nozzle element is connected cylindrically and eccentrically at an upper side of the front wall of the vaporizer housing.

10. The metallizing device, in accordance with claim 9, wherein the vaporizer includes an inert gas connection. side of the front wall of the vaporizer housing.

11. A metallizing device for a vacuum-metallizing arrangement, comprising:

a vaporizer, including a vaporizer housing that defines a pot for containing introduced metal to be vaporized, wherein the vaporizer includes an electrical heater for heating the introduced metal;

a nozzle element having a front face connected with the vaporizer housing, wherein the nozzle element includes a nozzle gap to allow produced metal vapor to exit, and wherein the nozzle element includes a hollow element connected to the vaporizer; and a closure element between the vaporizer housing and the nozzle element including a rotary slide for opening and closing a passage between the nozzle element and the vaporizer housing.

12. A metallizing device for a vacuum-metallizin arrangement, comprising:

a vaporizer, including a vaporizer housing that defines a pot for containing introduced metal to be vaporized, wherein the vaporizer includes an electrical heater for heating the introduced metal, and wherein the vaporizer housing includes a first front face and a second front face opposite the first front face;

a nozzle element with a nozzle gap to allow produced metal vapor to exit, wherein the nozzle element includes a hollow element connected to the vaporizer, and wherein the nozzle element includes a face connected to one of the first front face or the second front face of the vaporizer;

a first pair of flange plates gripping across the first front face of the vaporizer housing;

a second pair of flange plates gripping across the second front face of the vaporizer housing, wherein the first pair of flange plates and the second pair of flange plates are arranged as a current supply, wherein the first pair of flange plates are connected to ground and the second pair of flange plates are connected to a voltage supply; and heating wires provided along an outside of the vaporizer housing extending between the first pair of flange plates and the second pair of flange plates.

13. The metallizing device, in accordance with claim 12, wherein the heating wires are surrounded by a metal cover, arranged coaxially with respect to the vaporizer housing.

14. The metallizing device, in accordance with claim 12, wherein the heating wires are in spiral form and are arranged, respectively, in an insulation element correspondingly opened in a direction toward the vaporizer housing with a lesser cross-section than corresponds to a diameter of the spirals of the heating wire.

15. The metallizing device, in accordance with claim 11, wherein the vaporizer housing includes a first front face and a second front face, and the metallizing device further includes:

a first pair of flange plates gripping across the first front face of the vaporizer housing; a a second pair of flange plates gripping across the second front face of the vaporizer housing, wherein the first pair of flange plates and the second pair of flange plates are arranged as a current supply, wherein the first pair of flange plates are connected to ground and the second pair of flange plates are connected to a voltage supply; and heating wires provided along an outside of the vaporizer housing extending between the first pair of flange plates and the second pair of flange plates.

* * * * *